(12) United States Patent
Kaburagi et al.

(10) Patent No.: US 9,755,280 B2
(45) Date of Patent: Sep. 5, 2017

(54) SECONDARY BATTERY CONTROL DEVICE AND SOC DETECTION METHOD

(71) Applicant: NISSAN MOTOR CO., LTD., Kanagawa (JP)

(72) Inventors: Tomohiro Kaburagi, Yokohama (JP); Yasuhiko Ohsawa, Yokosuka (JP); Atsushi Itou, Yokosuka (JP); Takuya Kinoshita, Yokohama (JP)

(73) Assignee: Nissan Motor Co., Ltd., Yokohama-shi, Kanagawa (JP)

( * ) Notice: Subject to any disclaimer, the term of this patent is extended or adjusted under 35 U.S.C. 154(b) by 230 days.

(21) Appl. No.: 14/357,305

(22) PCT Filed: Oct. 24, 2012

(86) PCT No.: PCT/JP2012/077474
§ 371 (c)(1),
(2) Date: May 9, 2014

(87) PCT Pub. No.: WO2013/069459
PCT Pub. Date: May 16, 2013

(65) Prior Publication Data
US 2014/0320141 A1    Oct. 30, 2014

(30) Foreign Application Priority Data
Nov. 10, 2011 (JP) ................... 2011-246141

(51) Int. Cl.
*H02J 7/00* (2006.01)
*H02J 7/14* (2006.01)
(Continued)

(52) U.S. Cl.
CPC ........... *H01M 10/48* (2013.01); *H02J 7/1461* (2013.01); *G01R 31/362* (2013.01); *H02J 7/0047* (2013.01); *H02J 7/0086* (2013.01)

(58) Field of Classification Search
USPC ....... 320/132, 134, 136, 149, 104, 113, 116, 320/148, 150; 324/426, 427, 425, 433,
(Continued)

(56) References Cited

U.S. PATENT DOCUMENTS

| 7,154,247 B2 * | 12/2006 | Kikuchi ........... G01R 19/16542 320/132 |
| 2002/0113595 A1 * | 8/2002 | Sakai ..................... B60K 6/445 324/433 |

(Continued)

FOREIGN PATENT DOCUMENTS

| JP | 11-289685 A | 10/1999 |
| JP | 2000078757 A | 3/2000 |

(Continued)

OTHER PUBLICATIONS

M. Roscher et al., "Dynamic electric behavior and open-circuit-voltage modeling of LiFePO4-based lithium ion secondary batteries", Journal of Power Sources, vol. 196 (2011), pp. 331-336.

*Primary Examiner* — Alexis Pacheco
(74) *Attorney, Agent, or Firm* — Young Basile Hanlon & MacFarlane, P.C.

(57) ABSTRACT

A control device of a secondary battery uses, as material of a positive electrode, positive electrode active material that shows a difference of an open circuit voltage curve between charging and discharging. A storing unit stores, as discharge open circuit voltage information, a relationship between an SOC in a discharge process and an open circuit voltage for each changeover SOC that is an SOC when changing a state of the secondary battery from the charge to the discharge. An SOC calculating unit calculates the SOC of the secondary battery in the discharge process on the basis of a changeover SOC when actually performing the change from the charge to the discharge and the discharge open circuit voltage (Continued)

information stored in the storing unit. It is therefore possible to properly detect the SOC during the discharge.

5 Claims, 7 Drawing Sheets

(51) Int. Cl.
    *H01M 10/48*     (2006.01)
    *G01R 31/36*     (2006.01)

(58) Field of Classification Search
    USPC ........................................ 324/424, 429, 430
    See application file for complete search history.

(56) References Cited

U.S. PATENT DOCUMENTS

| | | | | |
|---|---|---|---|---|
| 2004/0257045 | A1* | 12/2004 | Sada | G01R 31/3668 320/132 |
| 2005/0073315 | A1 | 4/2005 | Murakami et al. | |
| 2006/0022643 | A1* | 2/2006 | Brost | G01R 31/3648 320/132 |
| 2008/0136378 | A1* | 6/2008 | Iwahana | G01R 31/3651 320/153 |
| 2011/0119005 | A1* | 5/2011 | Majima | G01R 31/361 702/63 |
| 2014/0225622 | A1* | 8/2014 | Kudo | B60L 3/0046 324/433 |

FOREIGN PATENT DOCUMENTS

| | | |
|---|---|---|
| JP | 2000078769 A | 3/2000 |
| JP | 2002238106 A | 8/2002 |
| JP | 2008-181830 A | 8/2008 |
| JP | 2008270201 A | 11/2008 |
| JP | 4292721 B2 | 7/2009 |
| KR | 20050032492 A | 4/2005 |

* cited by examiner

SECONDARY BATTERY CONTROL DEVICE AND SOC DETECTION METHOD

CROSS REFERENCE TO RELATED APPLICATION

The present application claims priority to Japanese Patent Application No. 2011-246141, filed Nov. 10, 2011, incorporated herein in its entirety.

TECHNICAL FIELD

The present invention relates to a control device of a secondary battery and an SOC (State of Charge) detection method of the secondary battery.

BACKGROUND

In recent years, for a secondary battery such as a lithium secondary battery, various kinds of materials for positive electrode active material have been studied with the aim of achieving high voltage and high capacity. As such positive electrode active material, for instance, Japanese Patent Provisional Publication Tokkai No. 2008-270201 discloses solid solution material such as $Li_2MnO_3$—$LiMO_2$ (M is transition metal whose average oxidation state is 3+).

Regarding the solid solution material disclosed in Japanese Patent Provisional Publication Tokkai No. 2008-270201, depending on its composition etc., there is a case where a hysteresis phenomenon in which an open circuit voltage curve during charge and an open circuit voltage curve during discharge are quite different occurs. Then, when the positive electrode active material showing the occurrence of the hysteresis phenomenon is applied to the secondary battery, due to an influence of the hysteresis phenomenon, the open circuit voltage curve during discharge, of the secondary battery, changes (or differs) depending on an SOC at a start of the discharge. Thus the SOC in a discharge process cannot be properly detected.

SUMMARY

An object of the present invention is, in a case of the secondary battery using, as the material of the positive electrode, the positive electrode active material that shows the difference of the open circuit voltage curve between during the charge and the discharge, to provide a control device of the secondary battery, which is capable of properly detecting the SOC at the discharge.

The present invention is a control device of a secondary battery using, as material of a positive electrode, positive electrode active material that shows a difference of an open circuit voltage curve between during charge and discharge, which previously stores, as discharge open circuit voltage information, a relationship between an SOC in a discharge process and an open circuit voltage for each changeover SOC that is an SOC when changing a state of the secondary battery from the charge to the discharge, and calculates the SOC of the secondary battery in the discharge process on the basis of the pre-stored discharge open circuit voltage information.

According to the present invention, since the SOC in the discharge process can be detected on the basis of the relationship between the SOC and the open circuit voltage which corresponds to the changeover SOC when actually performing the change from the charge to the discharge, it is possible to properly detect the SOC during the discharge, of the secondary battery using, as material of the positive electrode, positive electrode active material that shows the difference of an open circuit voltage curve between during charge and discharge.

DESCRIPTION OF EMBODIMENTS

In the following description, embodiments of the present invention will be explained with reference to the drawings.

Figure 1:
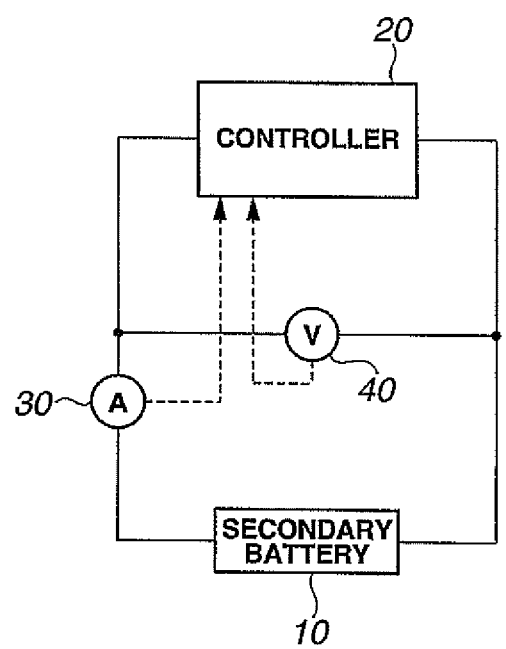
FIG. 1 is a block diagram showing a control system of a secondary battery according to an embodiment of the present invention.

FIG. 1 is a diagram showing a configuration of a control system of a secondary battery according to a present embodiment. As shown in FIG. 1, the control system of the secondary battery according to the present embodiment has a secondary battery 10, a controller 20, an ammeter 30 and a voltmeter 40.

The controller 20 is a device to control the secondary battery 10. The controller 20 controls charge and discharge of the secondary battery 10 and also calculates an SOC (State of Charge) of the secondary battery 10 on the basis of charge/discharge currents flowing in the secondary battery 10 and detected by the ammeter 30 and a terminal voltage of the secondary battery 10 detected by the voltmeter 40.

Figure 2:
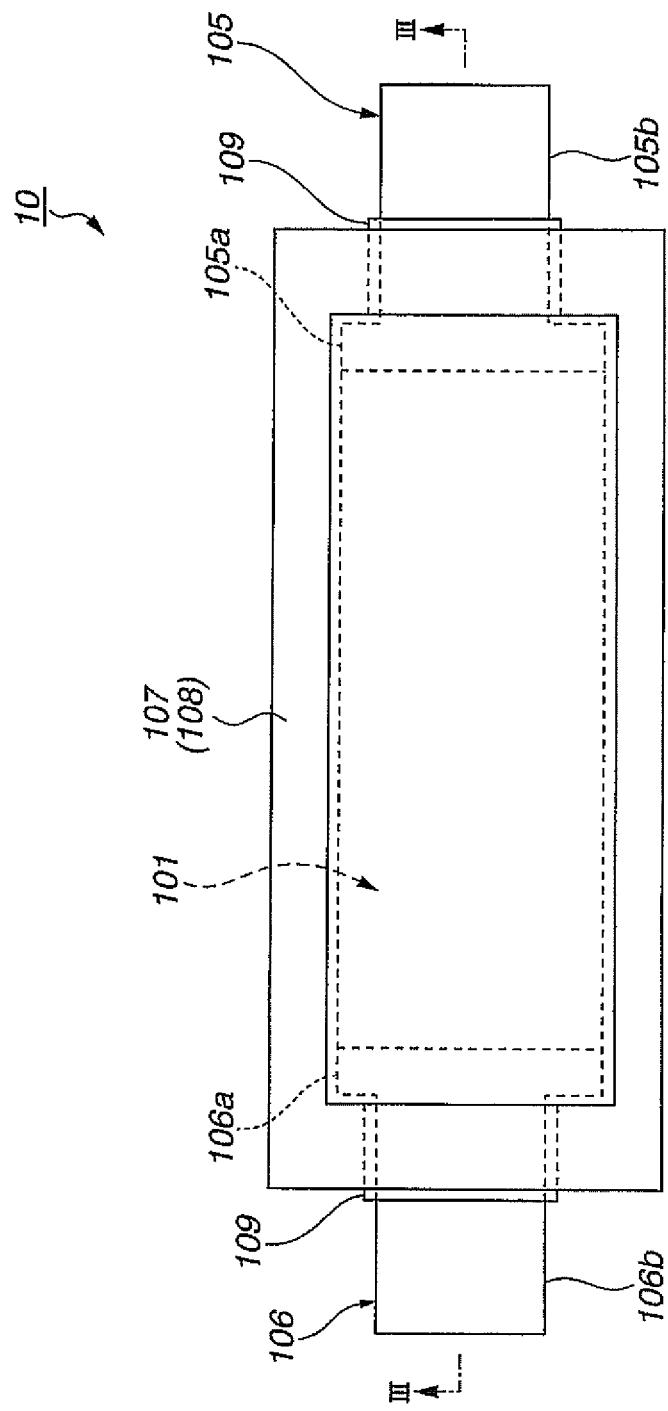
FIG. 2 is a plan view of the secondary battery.
Figure 3:
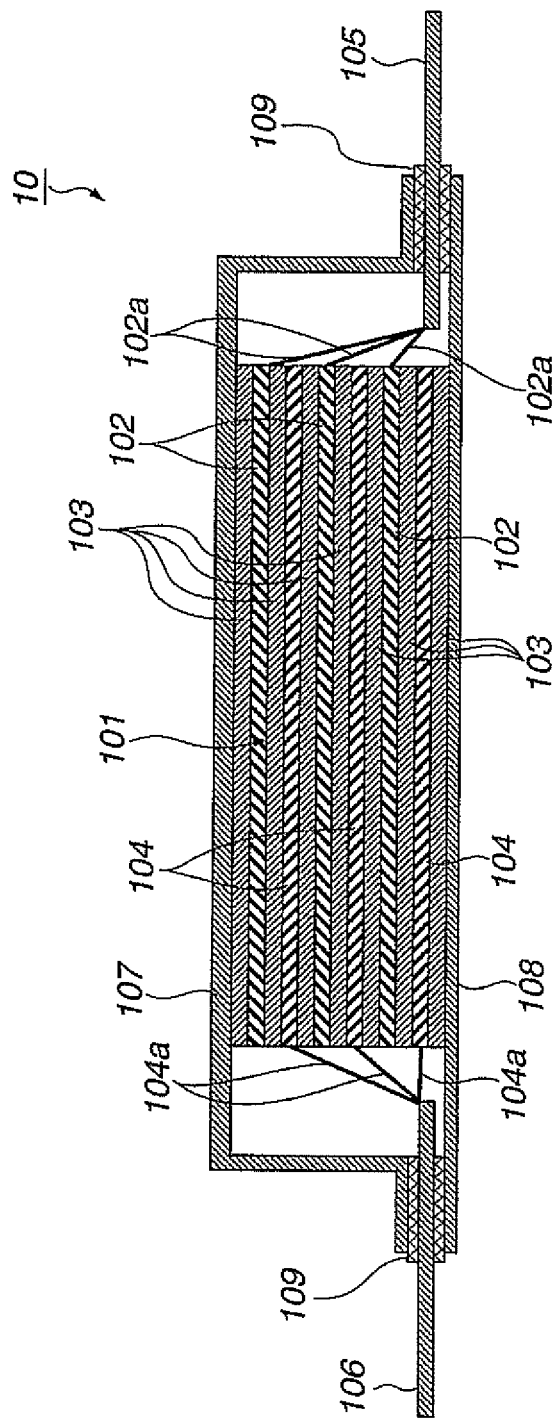
FIG. 3 is a sectional view of the secondary battery, taken along a line of FIG. 2.

As the secondary battery 10, it is, for instance, a lithium-based secondary battery such as a lithium-ion secondary battery. FIG. 2 shows a plan view of the secondary battery 10 of the present embodiment. FIG. 3 shows a sectional view of the secondary battery 10, taken along a line of FIG. 2.

As shown in FIGS. 2 and 3, the secondary battery 10 is formed from an electrode layered unit (an electrode stack) 101 having three positive electrode plates 102, seven separators 103 and three negative electrode plates 104, a positive electrode tab 105 and a negative electrode tab 106 which are each connected to the electrode stack 101, an upper jacket member 107 and a lower jacket member 108 which accommodate therebetween these electrode stack 101, positive electrode tab 105 and negative electrode tab 106 and seals them, and electrolyte (not shown).

Here, the number of each of the positive electrode plate 102, the separator 103 and the negative electrode plate 104 is not especially limited. The electrode stack 101 could be formed by one positive electrode plate 102, three separators 103 and one negative electrode plate 104. Further, the number of each of the positive electrode plate 102, the separator 103 and the negative electrode plate 104 could be selected as necessary.

The positive electrode plate 102 forming the electrode stack 101 has a positive electrode side current collector 102a that extends up to the positive electrode tab 105 and positive electrode active material layers that are formed on both main surfaces of the positive electrode side current collector 102a. As the positive electrode side current collector 102a forming the positive electrode plate 102, it is, for instance, electrochemically stable metal leaf (or electrochemically stable metal foil) such as aluminium leaf (or foil), aluminium alloy leaf (or foil), copper leaf (or foil) and nickel leaf (or foil), each of which has about 20 μm thickness.

The positive electrode active material layer forming the positive electrode plate 102 is formed by applying a mixture of positive electrode active material, conductive agent such as carbon black, and adhesive such as aqueous dispersion of polyvinylidene fluoride or polytetrafluoroethylene to the main surfaces of the positive electrode side current collector 102a and drying and rolling them.

The secondary battery 10 of the present embodiment contains, as the positive electrode active material in the positive electrode active material layer forming the positive electrode plate 102, at least positive electrode active material that shows a difference of an open circuit voltage curve between during the charge and the discharge, i.e. positive electrode active material having hysteresis in a charge-discharge curve. As such the positive electrode active material showing the difference of the open circuit voltage curve between during the charge and the discharge, it is not especially limited. It is, for instance, a compound expressed by the following general expression (1). In particular, since the compound expressed by the following general expression (1) has high potential (high voltage) and high capacity, using this compound as the positive electrode active material enables the secondary battery 10 to have high energy density. Here, the compound expressed by the following general expression (1) normally forms solid solution.

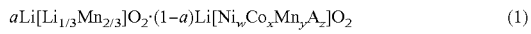  (1)

(0<a<1, w+x+y+z=1, 0≤w, x, y, z≤1, A is metallic element)

In the compound expressed by the above general expression (1), as the "A", it is not especially limited as long as the "A" is the metallic element (metallic element except Li, Ni, Co and Mn).

Further, in the compound expressed by the above general expression (1), although the "w", "x", "y", "z" are not especially limited as long as the "w", "x", "y", "z" meet w+x+y+z=1 and 0≤w, x, y, z≤1, it is preferable that z be 0 (z=0). That is, it is preferable that the compound be a compound expressed by the following general expression (2).

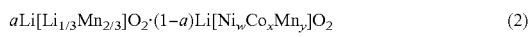  (2)

(0<a<1, w+x+y=1, 0≤w, x, y≤1)

Here, the positive electrode active material layer could contain positive electrode active material except the positive electrode active material showing the difference of the open circuit voltage curve between during the charge and the discharge, for instance, lithium compound oxide such as lithium nickelate ($LiNiO_2$), lithium manganate ($LiMn_2O_4$) and lithium cobalt oxide (lithium cobaltate) ($LiCoO_2$) and chalcogenide (S, Se, Te).

Each of the positive electrode side current collectors 102a forming the three positive electrode plates 102 is connected to the positive electrode tab 105. As the positive electrode tab 105, for instance, aluminium leaf (or foil), aluminium alloy leaf (or foil), copper leaf (or foil) and nickel leaf (or foil), each of which has about 0.2 mm thickness, could be used.

The negative electrode plate 104 forming the electrode stack 101 has a negative electrode side current collector 104a that extends up to the negative electrode tab 106 and negative electrode active material layers that are formed on both main surfaces of the negative electrode side current collector 104a.

The negative electrode side current collector 104a of the negative electrode plate 104 is, for instance, electrochemically stable metal leaf (or electrochemically stable metal foil) such as nickel leaf (or foil), copper leaf (or foil), stainless leaf (or foil) and iron leaf (or foil), each of which has about 10 μm thickness.

The negative electrode active material layer forming the negative electrode plate 104 is formed, for example, as follows. By mixing aqueous dispersion, which is precursor material of organic substance sintered member, such as styrene-butadiene-rubber resin powder with negative electrode active material, which occludes and releases lithium ions of the positive electrode active material, such as amorphous carbon, non-graphitizable carbon, graphitizable carbon and graphite and by grinding them after drying them, main material that carries or supports carbonized styrene-butadiene-rubber on a carbon particle surface is prepared. Binding agent such as acrylic resin emulsion is further mixed with this main material, then by coating the both main surfaces of the negative electrode side current collector 104a with this mixture and drying and rolling them, the negative electrode active material layer is formed.

In the secondary battery 10 of the present embodiment, the three negative electrode plates 104 are formed so that each of the negative electrode side current collectors 104a forming the negative electrode plates 104 is connected to the single negative electrode tab 106. That is, in the secondary battery 10 of the present embodiment, each negative electrode plate 104 is formed so as to connect to the single common negative electrode tab 106.

The separator 103 of the electrode stack 101 is an element that prevents a short circuit between the positive electrode plate 102 and the negative electrode plate 104. The separator 103 might have a function of holding the electrolyte. This separator 103 is a microporous film formed from, for instance, polyolefine such as polyethylene (PE) and polypropylene (PP) each having about 25 μm thickness, which also has a function of interrupting current by the fact that when overcurrent (excess current) flows, pores on the layer are closed by heat of the overcurrent.

As shown in FIG. 3, by alternately arranging the positive electrode plate 102 and the negative electrode plate 104 in layers through the separator 103 and also by arranging the separator 103 on an uppermost layer and a lowermost layer of this layered arrangement, the electrode stack 101 is formed.

The electrolyte which the secondary battery 10 contains is liquid obtained by dissolving, as a solute, lithium salt such as lithium perchlorate ($LiClO_4$), lithium tetrafluoroborate ($LiBF_4$), lithium hexafluorophosphate ($LiPF_6$) and lithium hexafluoroarsenate ($LiAsF_6$) in organic liquid solvent. As the organic liquid solvent forming the electrolyte, it is, for instance, ester-based solvent such as propylene carbonate (PC), ethylene carbonate (EC), buthylene carbonate (BC), dimethyl carbonate (DMC), ethyl methyl carbonate (EMC), diethyl carbonate (DEC), methyl formate (MF), methyl acetate (MA) and methyl propionate (MP). These could be used as a mixture.

The electrode stack 101 formed in this manner is accommodated between and sealed with the upper jacket member 107 (sealing means or element) and the lower jacket member 108 (sealing means or element). The upper jacket member 107 and the lower jacket member 108 to seal the electrode stack 101 are formed by material having flexibility, e.g. a resin film such as polyethylene and polypropylene or a resin-metal thin film laminate material obtained by bonding (or laminating) resin such as the polyethylene and the polypropylene onto both surfaces of metal foil such as aluminum. By thermal-bonding (heat-bonding) these upper jacket member 107 and lower jacket member 108, the electrode stack 101 is sealed with the positive electrode tab 105 and the negative electrode tab 106 coming out to the outside.

The positive electrode tab 105 and the negative electrode tab 106 are each provided with a seal film 109 to secure absolute contact with the upper jacket member 107 and the lower jacket member 108 at portions where each of the positive electrode tab 105 and the negative electrode tab 106 contacts the upper jacket member 107 and the lower jacket member 108. As the seal film 109, it is not especially limited. It can be formed from, for instance, synthetic resin material having excellent resistance of electrolyte and good thermal adhesion performance such as polyethylene, modified polyethylene, polypropylene, modified polypropylene and ionomer.

The secondary battery 10 of the present embodiment is formed in the manner described above.

Next, a charge-discharge characteristic of the secondary battery 10 of the present embodiment will be explained.

Figure 4:
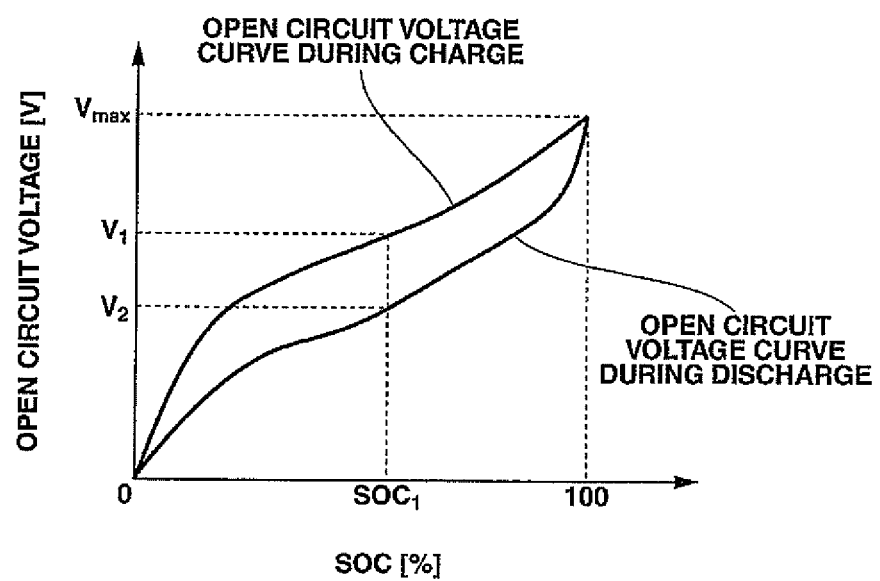
FIG. 4 is a graph showing a charge-discharge characteristic of the secondary battery.

As described above, the secondary battery 10 uses, as the positive electrode active material, the positive electrode active material showing the difference of the open circuit voltage curve between during the charge and the discharge, i.e. the positive electrode active material having the hysteresis in the charge-discharge curve. Because of this, as shown in FIG. 4, the open circuit voltage curve during the charge and the open circuit voltage curve during the discharge are different, and the secondary battery 10 has the hysteresis. That is, as shown in FIG. 4, when charging the secondary battery 10, an open circuit voltage of the secondary battery 10 is increased with rise of the SOC according to or along the open circuit voltage curve during the charge shown in FIG. 4. Then, when discharging the secondary battery 10 by changing (switching) the state of the secondary battery 10 from the charge to the discharge after the secondary battery 10 is fully charged up to a predetermined fully charged voltage Vmax (SOC=100%), the secondary battery 10 is discharged according to or along the open circuit voltage curve during the discharge shown in FIG. 4.

That is, as shown in FIG. 4, the secondary battery 10 has properties that, even same SOC, a value of the open circuit voltage is quite different between during the charge and the discharge. For this reason, even though the SOC is a same $SOC_1$ as shown in FIG. 4, the open circuit voltage during the charge is $V_1$, whereas the open circuit voltage during the discharge is $V_2$, then a voltage difference $\Delta V=V_1-V_2$ arises at the charge and the discharge.

Figure 5:
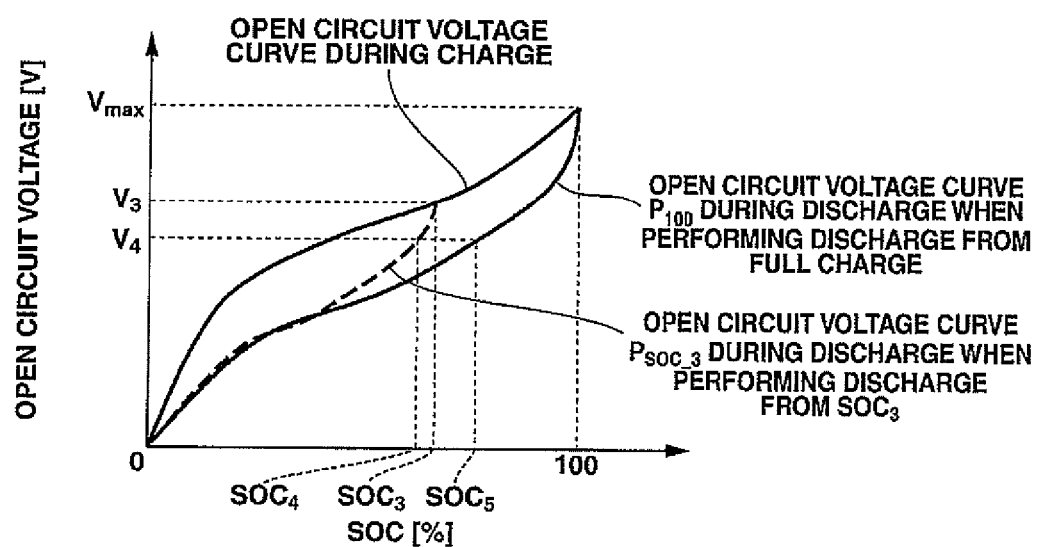
FIG. 5 is a graph showing a charge-discharge characteristic of the secondary battery.

In addition, regarding the secondary battery 10, for instance, as shown in FIG. 5, in a case where the secondary battery 10 is charged and the charge is stopped (finished) at a level at which the SOC becomes $SOC_3$ (at a level at which the open circuit voltage becomes $V_3$ (the open circuit voltage=$V_3$)) then the discharge is started by changing (switching) the charge of the secondary battery 10 to the discharge, the discharge is done according to or along an open circuit voltage curve shown by a dotted line in FIG. 5. That is, in this case, as shown in FIG. 5, the discharge is done according to or along a different open circuit voltage curve from the curve of the case where the charge is made (performed) up to the full charge.

Therefore, for instance, in FIG. 5, in the case where the charge is stopped (finished) at the level at which the SOC becomes $SOC_3$ (at the level at which the open circuit voltage becomes $V_3$ (the open circuit voltage=$V_3$)) and the discharge is done by changing (switching) the charge of the secondary battery 10 to the discharge, when the open circuit voltage of the secondary battery 10 becomes $V_4$, an actual SOC is $SOC_4$. On the other hand, for instance, on an open circuit voltage curve of a case where the discharge is done from a fully charged state (SOC=100%) shown in FIG. 5, when the open circuit voltage is $V_4$, the SOC is $SOC_5$, then this is different from a value of the actual SOC by $\Delta SOC=SOC_5-SOC_4$.

Thus, in the case, like the present embodiment, of the secondary battery 10 using, as the positive electrode active material, the positive electrode active material showing the difference of the open circuit voltage curve between during the charge and the discharge, when the SOC of the secondary battery 10 during the discharge of the secondary battery 10 is calculated from the open circuit voltage of the secondary battery 10, the following problem exists. That is, if only the open circuit voltage curve of the case where the discharge is done from the fully charged state (SOC=100%) shown in FIG. 5 is used when calculating the SOC of the secondary battery 10 from the open circuit voltage of the secondary battery 10, a different value from the actual SOC is calculated. As a consequence, in this case, the SOC of the secondary battery 10 could not be properly calculated.

For this problem, in the present embodiment, with respect to such characteristic of the secondary battery 10, by storing, in the controller 20, an open circuit voltage curve $P_{SOC}$ during the discharge for each changeover $SOC_{change}$ that is an SOC when changing (switching) the state of the secondary battery 10 from the charge to the discharge (i.e. an SOC at the end of the discharge) then by using the open circuit voltage curve $P_{SOC}$ for each changeover $SOC_{change}$, the problem mentioned above is solved. That is, in the present embodiment, the open circuit voltage curve $P_{SOC}$ for each changeover $SOC_{change}$ including an open circuit voltage curve $P_{100}$ during the discharge when switching the state of the secondary battery 10 from the charge to the discharge in the fully charged state (SOC=100%) and an open circuit voltage curve $P_{SOC\_3}$ during the discharge when switching the state of the secondary battery 10 from the charge to the discharge in a state in which the SOC is $SOC_3$ as shown in FIG. 5 is previously stored in the controller 20, then the SOC of the secondary battery 10 is calculated using the open circuit voltage of the secondary battery 10 and the open circuit voltage curve $P_{SOC}$ for each changeover $SOC_{change}$. Here, in the present embodiment, the open circuit voltage curve $P_{SOC}$ for each changeover $SOC_{change}$ can be obtained, for instance, by actually charging the secondary battery 10 up to each SOC and next actually discharging the secondary battery 10 by switching the state of the secondary battery 10 from the charge to the discharge then measuring data when these charge and discharge are actually performed.

Figure 6:
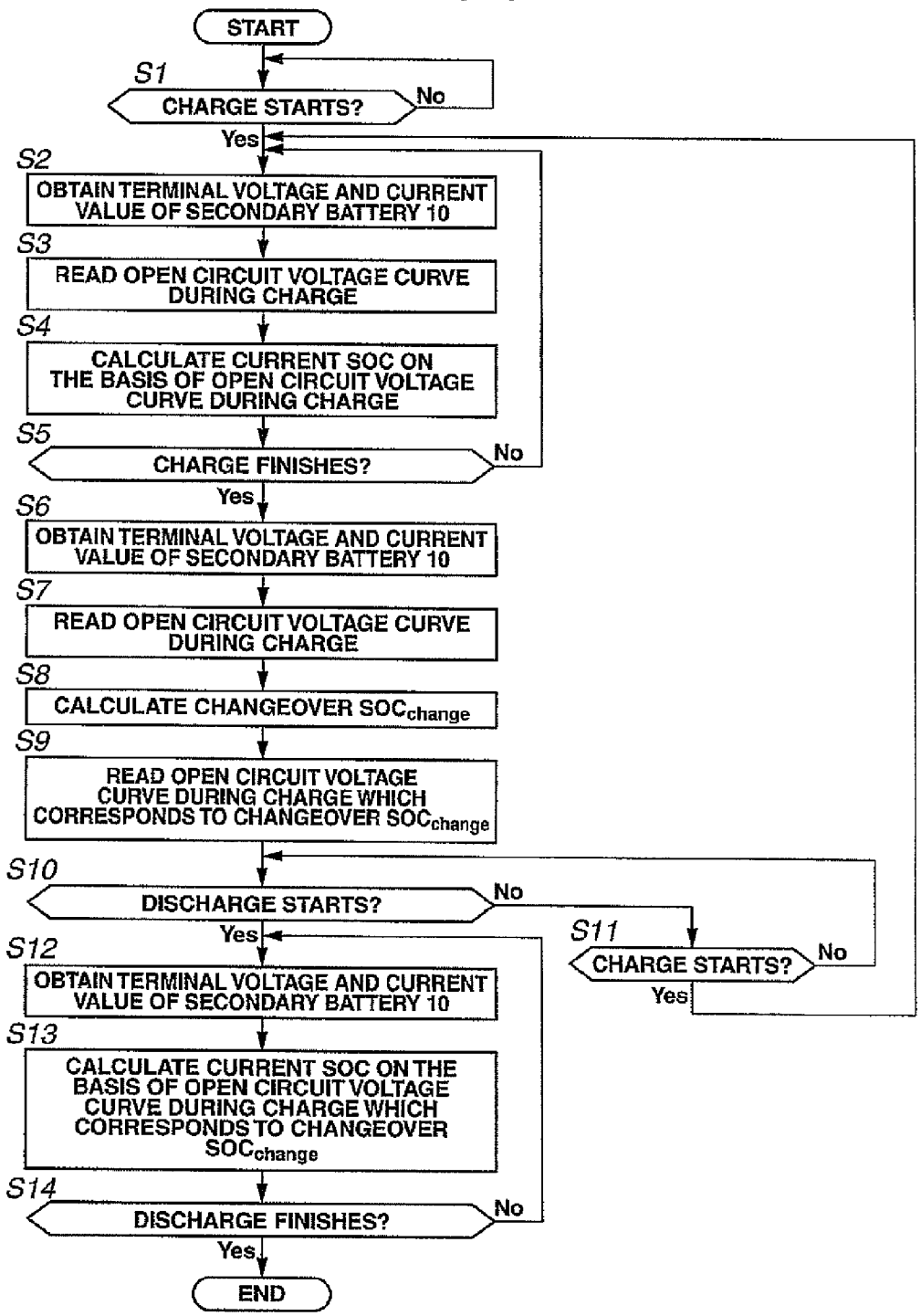
FIG. 6 is a flow chart showing a calculation process of an SOC.

Next, an example of operation of the present embodiment will be explained. FIG. 6 is a flow chart showing an SOC calculation process in the present embodiment. In the following description, an example of operation of a case where first the charge of the secondary battery 10 is performed and subsequently the charge of the secondary battery 10 is finished then the discharge of the battery 10 is performed by switching the charge to the discharge, will be explained.

First, at step S1, a judgment is made as to whether or not the charge of the secondary battery 10 is started by the controller 20. If the charge of the secondary battery 10 is started, the routine proceeds to step S2. On the other hand, if the charge of the secondary battery 10 is not started yet, the routine waits at step S1 until the charge is started.

At step S2, an operation of obtaining the terminal voltage of the secondary battery 10 measured by the voltmeter 40 and the current value of the secondary battery 10 measured ammeter 30 is performed by the controller 20.

At step S3, an operation of reading an open circuit voltage curve R during the charge of the secondary battery 10 which is previously stored in the controller 20 is performed by the controller 20. Here, the controller 20 stores the open circuit voltage curves R during the charge shown in FIGS. 4 and 5, in addition to the open circuit voltage curve $P_{SOC}$ during the discharge for each changeover $SOC_{change}$.

Subsequently, at step S4, an operation of calculating a current SOC of the secondary battery 10 is performed by the controller 20. More specifically, the controller 20 first calculates a current open circuit voltage of the secondary battery 10 from the terminal voltage and the current value of the secondary battery 10 obtained at step S2. Here, as a calculating manner of the current open circuit voltage of the secondary battery 10, it is not especially limited. For instance, it could be a manner in which, using a plurality of data of the terminal voltage and the current value of the secondary battery 10, a value of the terminal voltage when the current value is zero is estimated from the plurality of data of the terminal voltage and the current value using a regression line, and this value is calculated as the open circuit voltage.

Then, the controller 20 calculates a current SOC of the secondary battery 10 on the basis of the calculated open circuit voltage of the secondary battery 10 and the open circuit voltage curve R during the charge read out at step S3. That is, the controller 20 determines an SOC that corresponds to the calculated open circuit voltage of the secondary battery 10 on the open circuit voltage curve R during the charge read out at step S3, then calculates this SOC as the current SOC of the secondary battery 10.

Next, at step S5, a judgment is made as to whether or not the charge of the secondary battery 10 is finished by the controller 20. If the charge of the secondary battery 10 is finished, the routine proceeds to step S6. On the other hand, if the charge of the secondary battery 10 is not finished yet, the routine returns to step S2, then the operation of the steps S2 to S4 described above is repeated until the charge of the secondary battery 10 is finished.

If it is judged that the charge of the secondary battery 10 is finished at step S5, the routine proceeds to step S6. At step S6, an operation of obtaining the terminal voltage of the secondary battery 10 measured by the voltmeter 40 is performed by the controller 20.

Subsequently, the routine proceeds to step S7. At step S7, an operation of reading an open circuit voltage curve R during the charge of the secondary battery 10 which is previously stored in the controller 20 is performed by the controller 20.

Next, at step S8, an operation of calculating the changeover $SOC_{change}$ is performed by the controller 20. More specifically, the controller 20 first calculates a current open circuit voltage of the secondary battery 10. As a manner of calculating the current open circuit voltage of the secondary battery 10, for instance as same as that at step S4 described above, a value of the terminal voltage when the current value is zero is estimated from the terminal voltage and the current value of the secondary battery 10 measured during the charge of the secondary battery 10 and also the data of the terminal voltage of the secondary battery 10 obtained at step S7 using a regression line, and this value is calculated as the open circuit voltage. Or, in a case where the terminal voltage of the secondary battery 10 obtained at step S6 can be judged to be the same as the open circuit voltage (e.g. in a case where the terminal voltage of the secondary battery 10 obtained at step S7 is data that is measured when a predetermined time has elapsed after the charge of the secondary battery 10 is finished), the terminal voltage of the secondary battery 10 obtained at step S7 could be the open circuit voltage as it is.

Then, the controller 20 calculates the changeover $SOC_{change}$ on the basis of the calculated open circuit voltage of the secondary battery 10 and the open circuit voltage curve R during the charge read out at step S7. That is, the controller 20 determines an SOC that corresponds to the calculated open circuit voltage of the secondary battery 10 on the open circuit voltage curve R during the charge read out at step S7, then calculates this SOC as the changeover $SOC_{change}$. For instance, in the example shown in FIG. 5, when the open circuit voltage is $V_3$, the controller 20 refers to the open circuit voltage curve R during the charge, then calculates $SOC_3$ that corresponds to the open circuit voltage $V_3$ as the changeover $SOC_{change}$.

Subsequently, at step S9, an operation of reading an open circuit voltage curve $P_{SOC}$ that corresponds to the changeover $SOC_{change}$ calculated at step S8 from the open circuit voltage curve $P_{SOC}$ for each changeover $SOC_{change}$ previously stored in the controller 20 is performed by the controller 20. For instance, in the example shown in FIG. 5, when the changeover $SOC_{change}$ is $SOC_3$, as the open circuit voltage curve $P_{SOC}$, the open circuit voltage curve $P_{SOC\_3}$ corresponding to $SOC_3$ is read out.

Next, at step S10, a judgment is made as to whether or not the discharge of the secondary battery 10 is started by the controller 20. If the discharge of the secondary battery 10 is started, the routine proceeds to step S12. On the other hand, if the discharge of the secondary battery 10 is not started yet, the routine proceeds to step S11. Then, a judgment is made as to whether or not the charge of the secondary battery 10 is started, and the routine waits at step S10 until the discharge of the secondary battery 10 is started or the charge of the secondary battery 10 is started again. At step S11, if the charge of the secondary battery 10 is started again, the routine returns to step S2, and the operation of the steps S2 to S9 described above is executed again.

At step S10, when it is judged that the discharge of the secondary battery 10 is started, the routine proceeds to step S12. At step S12, an operation of obtaining the terminal voltage of the secondary battery 10 measured by the voltmeter 40 and the current value of the secondary battery 10 measured ammeter 30 is performed by the controller 20.

Subsequently, at step S13, an operation of calculating a current SOC of the secondary battery 10 is performed by the controller 20. More specifically, the controller 20 first calculates a current open circuit voltage of the secondary battery 10 from the terminal voltage and the current value of the secondary battery 10 obtained at step S12. Here, as a calculating manner of the current open circuit voltage of the secondary battery 10, it is not especially limited. For instance, as same as the manner at step S4 described above, it could be a manner in which, using a plurality of data of the terminal voltage and the current value of the secondary battery 10, a value of the terminal voltage when the current value is zero is estimated from the plurality of data of the terminal voltage and the current value using a regression line, and this value is calculated as the open circuit voltage.

Then, the controller 20 calculates a current SOC of the secondary battery 10 on the basis of the calculated open circuit voltage of the secondary battery 10 and the open circuit voltage curve $P_{SOC}$ corresponding to the changeover $SOC_{change}$ read out at step S9. That is, the controller 20 determines an SOC that corresponds to the calculated open circuit voltage of the secondary battery 10 on the open circuit voltage curve $P_{SOC}$ corresponding to the changeover $SOC_{change}$ read out at step S9, then calculates this SOC as the current SOC of the secondary battery 10. For instance, in the example shown in FIG. 5, when the open circuit voltage is $V_4$, the controller 20 refers to the open circuit voltage curve $P_{SOC\_3}$ corresponding to $SOC_3$ that is the changeover $SOC_{change}$, then calculates $SOC_4$ that corresponds to the open circuit voltage $V_4$ as the current SOC of the secondary battery 10.

Next, at step S14, a judgment is made as to whether or not the discharge of the secondary battery 10 is finished by the controller 20. If the discharge of the secondary battery 10 is finished, the present operation is terminated. On the other hand, if the discharge of the secondary battery 10 is not finished yet, the routine returns to step S12, then the operation of the steps S12 to S13 described above is repeated until the discharge of the secondary battery 10 is finished. That is, the operation of calculating the current SOC of the secondary battery 10 is repeated on the basis of the open circuit voltage curve $P_{SOC}$ corresponding to the changeover $SOC_{change}$ read out at step S9 until the discharge of the secondary battery 10 is finished.

The SOC calculation process (the SOC calculating operation) according to the present embodiment is carried out in the manner described above.

According to the present embodiment, the open circuit voltage curve $P_{SOC}$ during the discharge for each changeover $SOC_{change}$ that is the SOC (the SOC at the end of the discharge) when switching the state of the secondary battery 10 from the charge to the discharge is stored, and the open circuit voltage curve $P_{SOC}$ corresponding to the SOC (the SOC at the end of the discharge) when actually performing the switch from the charge to the discharge is selected, then the SOC corresponding to the open circuit voltage of the secondary battery 10 is calculated as the current SOC of the secondary battery 10 from the selected open circuit voltage curve $P_{SOC}$. Therefore, according to the present embodiment, regardless of the changeover $SOC_{change}$ that is the SOC when performing the switch from the charge to the discharge, the current SOC of the secondary battery 10 during the discharge can be properly calculated. Thus, this can improve calculation accuracy of the SOC of the secondary battery 10.

In addition, according to the present embodiment, as the open circuit voltage curve $P_{SOC}$ for each changeover $SOC_{change}$, the curve obtained by actually charging the secondary battery 10 up to each SOC and next actually discharging the secondary battery 10 by switching the charge to the discharge then measuring the data when these charge and discharge are actually performed, is used. Therefore, further improvement of the SOC calculation accuracy can be achieved.

Here, in the present embodiment described above, the secondary battery 10 corresponds to a secondary battery of the present invention, the controller 20 corresponds to a storing unit (storing means) and an SOC calculating unit (SOC calculating means) of the present invention.

Although the embodiment of the present invention has been explained above, the embodiment is described in order to facilitate an understanding of the present invention, and is not described to limit the present invention. Thus, each element or component disclosed in the above embodiment includes all design modifications and equivalents belonging to the technical scope of the present invention.

For instance, the above embodiment shows the example in which the curve obtained by actually measuring the data when the charge and the discharge are actually performed for each SOC is used as the open circuit voltage curve $P_{SOC}$ for each changeover $SOC_{change}$. However, for instance, such configuration that only the open circuit voltage curve $P_{100}$ whose predetermined changeover $SOC_{change}$ is SOC=100% is stored is possible. In this case, by calculating the open circuit voltage curve $P_{SOC}$ that corresponds to an actual changeover $SOC_{change}$ from the open circuit voltage curve $P_{100}$ using a predetermined relational expression, the open circuit voltage curve $P_{SOC}$ corresponding to the actual changeover $SOC_{change}$ can be obtained. By employing such configuration, an amount of memory in the controller 20 can be reduced, thereby lightening a load of the controller 20. Here, in this case, instead of the open circuit voltage curve $P_{100}$ whose predetermined changeover $SOC_{change}$ is SOC=100%, for instance, such configuration that an open circuit voltage curve $P_{80}$ whose predetermined changeover $SOC_{change}$ is SOC=80% or an open circuit voltage curve $P_{50}$ whose predetermined changeover $SOC_{change}$ is SOC=50% is stored is also possible. Further, a configuration in which a plurality of open circuit voltage curves $P_{SOC}$ (e.g. $P_{100}$, $P_{80}$, $P_{50}$) are stored is also possible.

Or, instead of using, as the open circuit voltage curve $P_{SOC}$ for each changeover $SOC_{change}$, the curve obtained by actually measuring the data when the charge and the discharge are actually performed for each SOC, a configuration in which only a predetermined relational expression for calculating the open circuit voltage curve $P_{SOC}$ for each changeover $SOC_{change}$ is stored and the open circuit voltage curve $P_{SOC}$ corresponding to the actual changeover $SOC_{change}$ is calculated using only the relational expression can be employed.

The present invention will be explained below on the basis of a further detailed embodiment. However, the present invention is not limited to the embodiment.

<Synthesis of Positive Electrode Active Material>

Synthesis of the positive electrode active material was performed using a composite carbonate method as follows. First, a predetermined amount of each of nickel sulfate, cobalt sulfate and manganese sulfate is weighed, and these were dissolved in ion-exchange water, then a mixed aqueous solution of 2M was obtained. Next, by dropping sodium carbonate aqueous solution in the aqueous solution obtained, Ni—Co—Mn composite carbonate deposited. Subsequently, volatile component was vaporized or evaporated from the aqueous solution in which the Ni—Co—Mn composite carbonate deposited, then the aqueous solution was dried. Next, by baking it at a baking temperature 700° C., Ni—Co—Mn composite oxide was obtained. Then, by mixing the Ni—Co—Mn composite oxide obtained and lithium hydroxide and baking it at 900° C. in the atmosphere, the positive electrode active material was obtained. Here, the positive electrode active material obtained was solid solution, and its composition was Li [$Ni_{0.213}$ $Li_{0.180}$ $Co_{0.033}$ $Mn_{0.573}$]$O_2$.

<Making of Secondary Battery>

Next, the positive electrode was made using the solid solution positive electrode active material obtained. More specifically, by dispersing the solid solution positive electrode active material, carbon-based conductive aid (or carbon-based conductive assistant) and polymer-based binding material in N-methyl-pyrrolidone so that their composition ratio is, the solid solution positive electrode active material: the conductive aid:the binding material=85:10:5 (weight ratio), slurry for the positive electrode was prepared. Then, by applying the positive electrode slurry obtained onto aluminium leaf (or foil), the positive electrode was obtained. Here, an amount of the active material per unit area of the positive electrode obtained is about 10 mg. A sample of the positive electrode whose size is 15 mmφ was made from the positive electrode obtained.

Subsequently, apart from the above positive electrode, the negative electrode was made. For the negative electrode, graphite as the negative electrode active material and TAB-2 (acetylene black:PTFE binder=1:1 (weight ratio)) as conductive binding material were used. Further, for the negative electrode current collector, stainless mesh was used, then a sample of the negative electrode whose size is 16 mmφ was made.

Then, the positive electrode sample obtained having 15 mmφ size and the negative electrode sample obtained having 16 mmφ size were dried at 120° C. for 4 hours in a dryer. Next, the positive and negative electrodes were stacked (layered) so as to face to each other with two porous films of polypropylene having 20 μm thickness inserted between these dried positive and negative electrode samples, then this stack was put on a bottom of a coin cell. To secure insulation between the positive and negative electrodes, a gasket was mounted. After that, electrolyte was injected or infused using a syringe. Then, after stacking (layering) a spring and a spacer, by stacking and joining a top of the coin cell to the bottom of the coin cell, the secondary battery was made. Here, as the electrolyte, 1M $LiPF_6$ ethylene carbonate (EC):diethyl carbonate (DEC) (1:2 (volume ratio)) were used.

<Pretreatment of Charge/Discharge>

The above secondary battery obtained was charged at constant current of 0.1 C (1 C=200 mAh/g) until its voltage reaches 4.4V. Next, the secondary battery was discharged up to 2.0V at the constant current of 0.1 C. Subsequently, by repeatedly performing the 0.1 C-constant current charge and the 0.1 C-constant current discharge (cut-off voltage: 2.0V) with a final voltage of the charge changed to 4.4V, 4.5V, 4.6V, and 4.7V, pretreatment of charge/discharge was carried out.

<Charge/Discharge Test>

By repeatedly performing the 0.1 C-constant current charge and the 0.1 C-constant current discharge (cut-off voltage: 2.0V) of the secondary battery underwent the charge/discharge pretreatment with the final voltage of the charge changed to 4.7V, 4.6V, 4.5V, 4.05V and 3.7V, charge/discharge test was carried out. Charge-discharge curves obtained from a result of the charge/discharge test is shown in FIG. 7.

Figure 7:
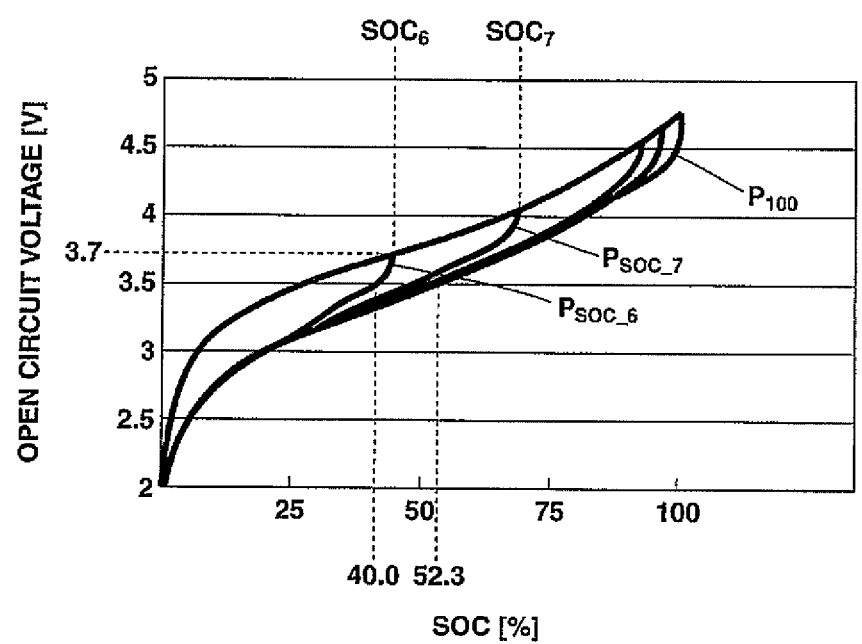
FIG. 7 is a graph showing a charge-discharge profile.

In the present embodiment, among the charge-discharge curve shown in FIG. 7, the charge was performed with the final voltage of the charge set 3.7V, and the discharge was performed. Then, when performing the discharge, an SOC at a time when the open circuit voltage during the discharge is 3.50V was calculated by the SOC calculating manner of the present embodiment, an SOC calculating manner of the related art and an SOC calculating manner by an actual measurement. Here, regarding the SOC calculating manner of the present embodiment, using an open circuit voltage curve $P_{SOC\_6}$ corresponding to an $SOC_6$ that is the changeover SOC corresponding to the charge-end open circuit voltage 3.7V (the open circuit voltage 3.7V at a time when the charge has ended) from among the pre-stored open circuit voltage curve $P_{SOC}$ for each changeover $SOC_{change}$, the calculation of the SOC was performed. Further, regarding the SOC calculating manner of the related art, using the open circuit voltage curve $P_{100}$ of the full charge, the calculation of the SOC was performed. The calculation result is shown below.

SOC calculating manner of the present embodiment
SOC=40.0%
SOC calculating manner of the related art
SOC=52.3%
SOC calculating manner by the actual measurement
SOC=40.9%

In view of the foregoing, according to the SOC calculating manner of the present embodiment, it can be confirmed that it is possible to get the result that is extremely close to the result by the SOC calculating manner by the actual measurement.

Likewise, among the charge-discharge curve shown in FIG. 7, the charge was performed with the final voltage of the charge set 4.05V, and the discharge was performed. Then, when performing the discharge, an SOC at a time when the open circuit voltage during the discharge is 3.84V was calculated by the SOC calculating manner of the present embodiment, the SOC calculating manner of the related art and the SOC calculating manner by the actual measurement. Then the following result was obtained. Here, regarding the SOC calculating manner of the present embodiment, using an open circuit voltage curve $P_{SOC\_7}$ corresponding to an $SOC_K$ that is the changeover SOC corresponding to the charge-end open circuit voltage 4.05V (the open circuit voltage 4.05V at a time when the charge has ended) from among the pre-stored open circuit voltage curve $P_{SOC}$ for each changeover $SOC_{change}$, the calculation of the SOC was performed.

SOC calculating manner of the present embodiment
SOC=65.8%
SOC calculating manner of the related art
SOC=75.2%
SOC calculating manner by the actual measurement
SOC=65.8%

In view of the foregoing, according to the SOC calculating manner of the present embodiment, it can be confirmed that it is possible to get the result that is extremely close to the result by the SOC calculating manner by the actual measurement.

The invention claimed is:

1. A control system of a secondary battery comprising:
an electrode using positive electrode active material that shows a difference between an open circuit voltage curve charge and an open circuit voltage curve during discharge; and
a voltmeter for detecting a terminal voltage of the secondary battery;
an ammeter for detecting a current value of the secondary battery;
a controller configured to detect the discharge of the secondary battery, the controller comprising:
a storing unit configured to store discharge open circuit voltage information, the discharge open circuit voltage information being a relationship between an SOC in a discharge process and an open circuit voltage for each changeover SOC, wherein a changeover SOC being defined as an SOC when changing a state of the secondary battery from charging to discharging;

an SOC calculating unit configured to calculate the SOC of the secondary battery in the discharge process, by:
in response to determining that a charge of the secondary battery is finished:
obtaining the terminal voltage form the voltmeter;
obtaining the current value from the ammeter;
determining an open circuit voltage based on the terminal voltage and the current value;
determining a changeover SOC, wherein the changeover SOC corresponds to the open circuit voltage on the open circuit voltage curve during charge;
obtaining, from the storing unit, a relationship based on the changeover SOC, wherein the relationship differs from the open circuit voltage curve during discharge; and
in response to determining a discharge of the secondary battery is started, using the relationship to determine the SOC of the secondary battery; and
discharging the secondary battery according to the relationship instead of according to the open circuit voltage curve during discharge.

2. The control system of the secondary battery as claimed in claim 1, wherein the positive electrode active material contains a compound expressed by a following general expression:

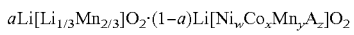

$a\text{Li}[\text{Li}_{1/3}\text{Mn}_{2/3}]\text{O}_2 \cdot (1-a)\text{Li}[\text{Ni}_w\text{Co}_x\text{Mn}_y\text{A}_z]\text{O}_2$ wherein: $0<a<1$,
$w+x+y+z=1$,
$0 \leq w, x, y,$
$z \leq 1$, and
A is metallic element.

3. The control system of the secondary battery as claimed in claim 1, wherein:
the storing unit stores, as the discharge open circuit voltage information, information that is obtained by actually measuring the relationship between the SOC in the discharge process and the open circuit voltage for each changeover SOC.

4. The control system of the secondary battery as claimed in claim 1, wherein:
the storing unit stores, as the discharge open circuit voltage information, at least one predetermined SOC discharge open circuit voltage information that is obtained by actually measuring the relationship between the SOC in the discharge process and the open circuit voltage when performing the discharge by changing the state of the secondary battery from the charge to the discharge at a predetermined SOC, and the SOC calculating unit calculates, from the predetermined SOC discharge open circuit voltage information, the relationship between the SOC in the discharge process and the open circuit voltage which corresponds to the changeover SOC when actually performing the change from the charge to the discharge, and calculates the SOC of the secondary battery in the discharge process on the basis of the calculated relationship between the SOC and the open circuit voltage.

5. A method for determining an SOC of a secondary battery having, due to positive electrode active material, an open circuit voltage curve during charge that differs from an open circuit voltage curve during discharge, the method comprising:
for each discharge process,
obtaining, by a voltmeter, a terminal voltage of the secondary battery;
obtaining, by an ammeter, a current value of the secondary battery;
determine, by an SOC calculation unit, an open circuit voltage value based on the terminal voltage and the current value;
determining, by an SOC calculation unit, a relationship between an SOC value and the open circuit voltage value, which is determined for each changeover SOC, a changeover SOC being defined as an SOC when changing a state of the secondary battery from charging to discharging and an SOC of the secondary battery at a start of the discharge; and
storing, by a storing unit, the relationship between the SOC value and the respective open circuit voltage; and
in response to detecting an actual changeover from charge to discharge of the secondary battery:
retrieving, by the SOC calculation unit, a stored relationship from the storing unit, the stored relationship corresponding to a changeover SOC;
obtaining the terminal voltage form the voltmeter;
obtaining the current value from the ammeter;
determining the open circuit voltage based on the terminal voltage and the current value;
calculating, by the SOC calculation unit, the SOC of the secondary battery in an actual discharge process based on stored relationship and the open circuit voltage; and
discharging the secondary battery according to the stored relationship and the open circuit voltage instead of according to an open circuit voltage curve during discharge of the secondary battery.

* * * * *